United States Patent [19]

Ito et al.

[11] 4,435,447
[45] Mar. 6, 1984

[54] METHOD FOR FORMING AN INSULATING FILM ON A SEMICONDUCTOR SUBSTRATE SURFACE

[75] Inventors: Takashi Ito, Kawasaki; Takao Nozaki, Yokohama, both of Japan

[73] Assignee: Fujitsu Limited, Kawasaki, Japan

[21] Appl. No.: 322,718

[22] Filed: Nov. 18, 1981

Related U.S. Application Data

[63] Continuation of Ser. No. 105,094, Dec. 19, 1979, abandoned.

[30] Foreign Application Priority Data

Dec. 26, 1978 [JP] Japan ................ 53-163155

[51] Int. Cl.³ .............................................. B05D 5/12
[52] U.S. Cl. .................................. 427/94; 427/96; 427/255; 427/255.1; 427/255.4
[58] Field of Search ............... 427/94, 96, 255, 255.1, 427/255.3, 299, 248.1, 399, 255.4, 444, 255.2, 397.7, 402; 428/446

[56] References Cited

U.S. PATENT DOCUMENTS

| | | | |
|---|---|---|---|
| 3,549,411 | 12/1970 | Bean et al. | 427/255 |
| 3,649,886 | 3/1972 | Kooi | 427/94 |
| 3,765,935 | 10/1973 | Rand et al. | 427/94 |
| 3,874,919 | 4/1975 | Lehman | 427/94 |
| 4,105,805 | 8/1978 | Glendinning et al. | 427/94 |
| 4,181,751 | 1/1980 | Hall et al. | 427/94 |

FOREIGN PATENT DOCUMENTS

| | | | |
|---|---|---|---|
| 2414982 | 10/1974 | Fed. Rep. of Germany | 427/94 |
| 48-13991 | 5/1973 | Japan | 427/94 |
| 52-39376 | 3/1977 | Japan | 427/94 |

OTHER PUBLICATIONS

Electric Phenomena, vol. 68, 1968, 99887h.
Frieser, "Direct Nitridation of Silicon Substrates", J. Electrochemical Society: Solid State Science, vol. 115, No. 10 p. 1092–1094, Oct. 1968.

Primary Examiner—Sadie L. Childs
Attorney, Agent, or Firm—Staas & Halsey

[57] ABSTRACT

A method for forming an insulating film on the surface of a silicon semiconductor substrate of a semiconductor device. The semiconductor substrate is subjected to a direct thermal nitridation, in a gas atmosphere containing nitrogen or nitrogen atoms. The semiconductor substrate has an average concentration of oxygen of not more than $10^{18}/cm^3$. The silicon nitride film formed by the direct thermal nitridation is thin, even and amorphous. The structure of the interface between the silicon substrate and the silicon nitride film is highly dense.

9 Claims, 3 Drawing Figures

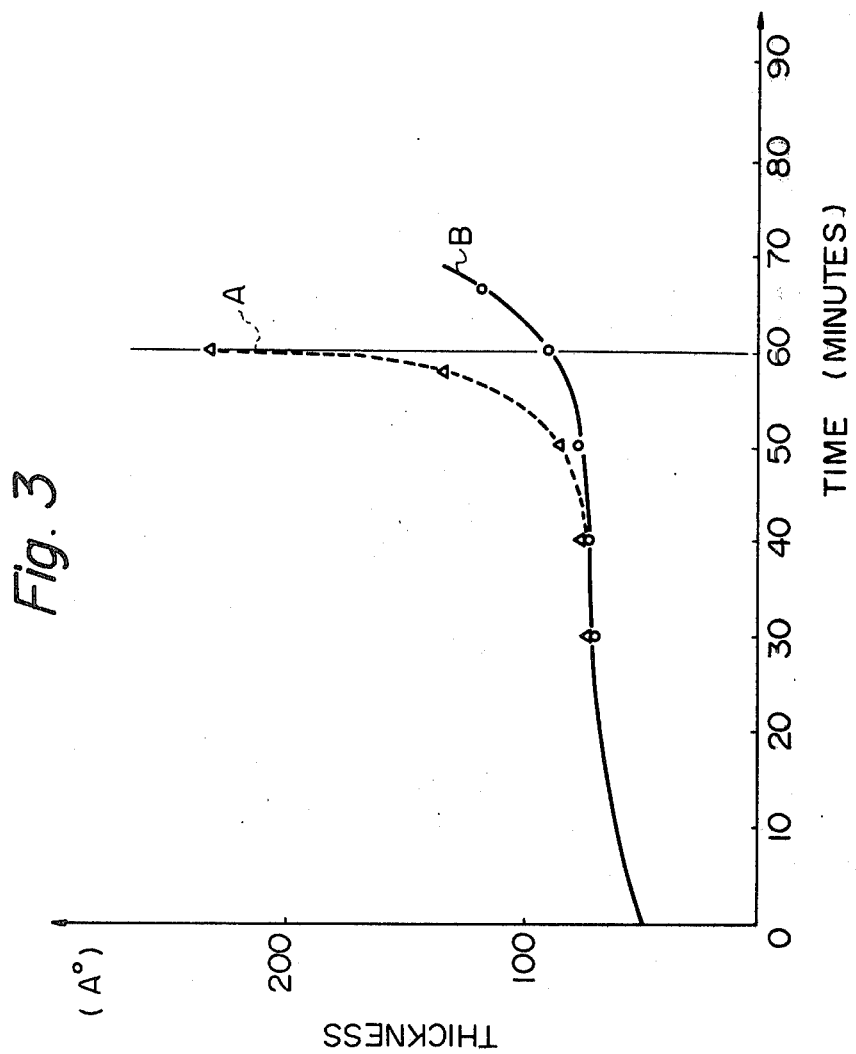

METHOD FOR FORMING AN INSULATING FILM ON A SEMICONDUCTOR SUBSTRATE SURFACE

This is a continuation of application Ser. No. 105,094 filed Dec. 19, 1979 abandoned.

BACKGROUND OF THE INVENTION

The present invention relates to a method for forming an insulating film on a semiconductor substrate surface. More particularly, the present invention relates to a method for forming a silicon nitride film which exhibits an excellent stability in electrical properties and a high degree of density, on a surface of a semiconductor substrate useful for the production of integrated circuits.

In the production of semiconductor devices, it is known that a portion of the semiconductor surface, in which a PN junction is exposed to an ambient atmosphere, is coated with an insulating film in order to prevent changes in the electrical properties of the semiconductor device with the lapse of time and to enhance the reliability of the semiconductor device. In the production of MISFET (metal insulator semiconductor field effect transistor) or MIS type integrated circuits, it is also known that a gate insulating film is formed in the semiconductor device, so as to introduce an inversion layer channel into the device. Generally speaking, in the conventional MISFET and MIS type integrated circuits, the semiconductor substrate, the insulating film and the metal gate electrode respectively consist essentially of silicon (Si), silicon oxide ($SiO_2$) and aluminum (Al). However, the above-mentioned structure of the conventional metal insulator semiconductor device exhibits a disadvantage in that an application of an electric field of about $10^6$V/cm onto the insulating film at a temperature of about 200° C. results in a significant fluctuation of the gate threshold voltage. This disadvantageous phenomenon may be due to the fact that the drift effect of impurity ions contained in the $SiO_2$ insulating film or the structural defects of the $SiO_2$ insulating film per se cause the creation of a capture level of carriers, and the creation of the cature level of carriers results in a significant fluctuation in the space charge distribution in the surface layer of the semiconductor device. It is clear that the fluctuation in the space charge distribution is influenced significantly by the structural defects in the interface between the Si substrate and the insulating film ($SiO_2$). Also, structural defects are created to a significant extent when the insulating film ($SiO_2$) is formed by thermally oxidizing the surface layer of the Si substrate. This thermal oxidation process tends to permit the impurity ions, such as alkali metal ions, to be contaminated in the oxidized silicon film. In order to eliminate the above-mentioned defects from the conventional insulating film, an attempt was made to provide an insulating film by way of a chemical vapor deposition or sputtering. However, all of the previous attempts failed to reduce the structural defects in the interface between the Si substrate and the $SiO_2$ layer to a level lower than that of the thermal oxidation.

Furthermore, it is known that when the surface of the Si substrate is thermally oxidized in an extremely clean atmosphere, the resultant $SiO_2$ film exhibits low structural defects at a level, in terms of surface charge density, of $10^{11}$/cm$^2$ or less. However, the interface between the Si substrate and the $SiO_2$ film still exhibits structural defects due to excessive silicon ions. Accordingly, it has been strongly desired to eliminate the above-mentioned defects from the interface between the Si substrate and the $SiO_2$ film.

On the other hand, recently, the increase in density of the integrated circuits is accompanied with a tendency to decrease the thickness of the gate insulating film in the semiconductor device. When a thinner insulating film is used, it is important that the resultant semiconductor device exhibits an excellent stability in electrical properties.

As a method for decreasing the variation in the electrical properties of the semiconductor device, it was attempted to provide a gate insulating film consisting of a silicon oxide film formed on a silicon substrate and a phospho-silicate glass (PSG) film formed on the silicon oxide film. However, in the case where the PSG film has a high concentration of phosphorus, an application of a high electric field onto the gate insulating film results in polarization of the gate insulating film. This polarization causes the potential of the semiconductor surface to undesirably fluctuate. Also, it was found that the reduction in the thickness of the silicon oxide film causes the operation of the resultant N channel enhancement type field effect transistor to be more difficult due to the diffusion of donor impurities from the polysilicon gate film into the silicon substrate.

In another method, it was tried to utilize a silicon nitride film or aluminum oxide film as a gate insulating film. However, since the above-mentioned films are provided by means of chemical vapor deposition, structural defects are locally created in the interface between the silicon substrate and the insulating film. These structural defects cause the electrical properties of the semiconductor device to be unstable.

Moreover, it was attempted to utilize a silicon nitride film which was produced by bringing a nitrogen or an ammonia gas atmosphere into contact with a surface of a silicon substrate heated to an elevated temperature so as to perform a nitridation reaction and to convert the surface portion of the silicon substrate into a silicon nitride. However, the silicon nitride film produced by the above-mentioned nitridation method sometimes exhibits structural defects in the interface between the silicon substrate and the silicon nitride film. Also, it is sometimes difficult to produce a silicon nitride film having an even structure and composition. The above-mentioned structural defects or the structural unevenness cause the electrical properties of the semiconductor device to be unstable.

SUMMARY OF THE INVENTION

An object of the present invention is to provide a method for forming a silicon nitride film on a surface of a semiconductor substrate without creating structural defects between the semiconductor substrate and the insulating film.

Another object of the present invention is to provide a method for forming a silicon nitride film having a high structural density on a surface of a semiconductor substrate.

Still another object of the present invention is to provide a method for evenly forming an insulating film consisting of silicon nitride on a surface of a semiconductor substrate consisting of silicon.

The above-mentioned objects can be attained by the method of the present invention which comprises bringing a surface of a silicon substrate into contact with a gas atmosphere containing nitrogen or nitrogen atoms, such as a nitrogen gas or an ammonia gas, at an elevated temperature, to convert the surface portion of the silicon substrate into a silicon nitride film. The silicon substrate used for the contact with the gas atmosphere has not more than $10^{18}/cm^3$ average concentration of oxygen.

BRIEF DESCRIPTION OF THE DRAWINGS

FIG. 3 shows the oxidation of an insulating film of the present invention in comparison to another insulating film.

DETAILED DESCRIPTION OF THE PREFERRED EMBODIMENTS

Figure 1:
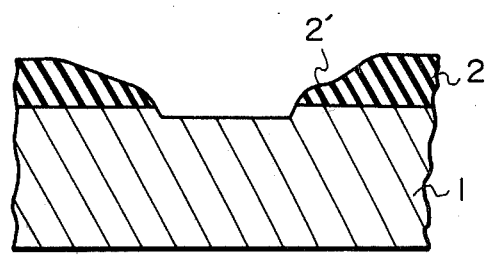
FIG. 1 shows a prior art problem with the thinning of an insulating layer at an aperture.

The present inventors discovered the following facts. When a silicon material is brought into contact with air or moisture at room temperature, a natural oxide film having a thickness of from about 8 to 12 Å is formed on the silicon material. A forming film of silicon nitride ($Si_3N_4$) crystallizes and grows during the nitridation, while the natural oxide film and other particles of impurity materials act as nuclei of the crystallization. Accordingly, the nitridation proceeds nonuniformly and locally, with the result that a homogeneous amorphous film of nitride is difficult to obtain. With regard to removal of the natural oxide film and particles of impurity materials which are deposited on the surface of a silicon substrate, the silicon substrate may, during the usual process of producing semiconductor devices, be heated within an atmosphere of hydrogen gas, with or without about 5% of hydrochloric acid gas, thereby subjecting the silicon substrate to a slight etching in a vapor phase of the etchant gas. However, in such a process of producing semiconductor devices, a phenomenon as illustrated in FIG. 1 occurs. Referring to FIG. 1, during a vapor phase etching within an atmosphere containing hydrogen gas, a silicon dioxide film 2, which covers a silicon substrate 1, becomes thin at a portion of the film adjacent to an exposing aperture of the substrate 1, while the silicon dioxide film remains thick at the other portions thereof. When the silicon dioxide film becomes thin at a portion thereof adjacent to active regions, such as MOS transistors and bipolar transistors, of IC and LSI devices having a high integration density, the active regions are liable to be short circuited with each other. In addition, when the silicon dioxide film becomes thin at passive regions of the IC and LSI devices, the threshold voltage of the passive regions of the ICs and LSIs becomes low, which is a problem.

The present inventors also discovered that, when the surface of a silicon material is pure and free from natural oxide film, an oxidation reaction occurs together with the nitridation reaction due to the oxygen ($O_2$) and water ($H_2O$) contained in the nitridation atmosphere. As a result, the homogeneous growth of silicon nitride ($Si_3N_4$) is inhibited because of the pure surface of silicon material.

The present inventors further discovered that a silicon nitride film formed within an ammonia-containing atmosphere is more dense and stable than that formed within a nitrogen gas atmosphere.

The present invention has been completed after the discoveries mentioned above and provides an improvement in a method for forming an insulating film on the surface of a semiconductor substrate. The improvement comprises subjecting the surface of a semiconductor substrate to direct nitridation in a gas atmosphere containing nitrogen or nitrogen atoms and using a silicon substrate having an average concentration of not more than $10^{18}/cm^3$ of oxygen incorporated into the substrate. A silicon nitride film, which is formed on a silicon substrate containing not more than $10^{18}/cm^3$ of oxygen has an even structure and composition, and excellent electrical properties. When the oxygen concentration of the silicon substrate is increased to more than $10^{18}/cm^3$, the masking time against oxidation of the masked silicon substrate by the silicon nitride film abruptly decreases. This fact demonstrates that the properties of the silicon nitride film are deteriorated by the oxygen contained in the substrate. It should be noted that the concentration of oxygen incorporated in the substrate has presented no problems in the formation of conventional insulating films by thermal oxidation in the production of IC and LSI devices. In addition, the concentration of incorporated oxygen in an amount of from about $1.5 \times 10^{18}$ to $2.0 \times 10^{18}/cm^3$ is equal to approximately 1/1000 times or less than the concentration of silicon atoms of the silicon crystal. Such a proportion of oxygen to silicon can generally be deemed to have no great influence upon the silicon nitride film which is formed by direct thermal nitridation of a silicon substrate. However, it has been discovered by the present inventors that, at a concentration of incorporated oxygen of not more than $10^{18}/cm^3$, the formed silicon nitride film has: a dense structure; essentially no defects at the interface between the silicon substrate and silicon nitride film; and excellent electrical properties. The difference in the concentration of incorporated oxygen in the silicon material produced by several growth methods will now be explained. The Czochlarski method, hereinafter referred to as the CZ method, and floating zone method, hereinafter referred to as the FZ method, are known growth methods.

In the CZ method, impurity materials, mainly carbon and oxygen, are dissolved from a quartz crucible and or inevitably incorporated into the growing crystal. Due to the incorporation phenomenon of the impurity materials, the concentration of impurity materials is increased to a level of from 1.3 to $2 \times 10^{18}/cm^3$, which corresponds to a saturation concentration of a solid solution. It is, therefore, usually impossible to obtain a silicon crystal having a high resistivity. A feature of the CZ method as compared with FZ method resides in the fact that a silicon substrate having a large surface area can be stably and inexpensively provided. Because of such feature, the silicon substrates produced by the CZ method are used in the production of semiconductor devices designed for small signals and small current capacity, particularly the IC and LSI devices. In these devices the production efficiency can be considerably enhanced due to the use of the large surface substrates.

On the other hand, the silicon substrate produced by the FZ method, hereinafter referred to as an FZ substrate, is crystallized in a floating state, as the term FZ implies, and a single crystal is obtained. The crystallized silicon substrate, therefore, is only negligibly influenced by the wall of the quartz tube. As a result, the concentration of oxygen incorporated in the crystal can be maintained at approximately $10^{16}/cm^3$ or less, and a crystal without dislocations can easily be obtained. The FZ substrate is used mainly for a power device, such as a rectifier and thyristor. However, since the FZ substrate has a small surface area and is expensive, the amount of FZ substrate industrially used is small.

The FZ substrate having not more than $10^{18}/cm^3$ average concentration of oxygen can be used in the present invention, for the production of the IC and LSI devices. The silicon nitride film formed on the surface of the FZ substrate has a dense structure which induces no problem in the actual operation of the IC and LSI devices. Previously, it was believed that the direct nitridation of a silicon material due to the nitridation reaction between the silicon material and nitrogen gas was possible.

In the method of the present invention, which is a novel technique of forming a silicon nitride film on the surface of a semiconductor substrate, the major reaction, which takes place during the formation of the insulating film, is a thermal nitridation of silicon due to the reaction between the silicon and nitrogen. However, a minor reaction, which may take place under the presence of a slight amount of oxygen in the nitridation atmosphere, is an oxidation of silicon. The nitridation and oxidation reactions take place simultaneously. According to the method of the present invention, a thin, homogeneous, amorphous, silicon nitride film can be formed. This fact implies that the silicon nitride film formed by the present invention has a small thickness in the range of from $10^{-3}$ to $10^{-1}$ microns, is free from crystallized portions, and has an even composition and structure.

The nitridation gas atmosphere according to the present invention may comprise nitrogen gas, or a nitrogen compound gas selected from the group consisting of ammonia ($NH_3$) and hydrazine ($N_2H_4$). The nitridation gas atmosphere may comprise nitrogen radicals, i.e. radicals of nitrogen, ammonia and hydrazine. The nitridation gas atmosphere may be a mixture which comprises an inert gas in addition to the nitrogen, nitrogen compound and the radicals. The oxygen content in the nitridation gas atmosphere should be as low as possible. The oxygen content in the nitridation gas atmosphere which comprises nitrogen should be preferably 1 ppm at the maximum, while the oxygen content of the nitrogen compound atmosphere should be 1000 ppm at the maximum.

The oxygen concentration may appreciably exceed the average oxygen concentration value of $10^{18}/cm^3$ due to a nonuniform distribution of oxygen incorporated into a silicon substrate, particularly at the surface of the silicon substrate. When the distribution of oxygen is nonuniform, as mentioned above, the concentration of oxygen incorporated into the silicon substrate should be $10^{18}/cm^3$ at the maximum.

The nitridation temperature is in the range of from 900° to 1300° C., preferably from 1000° to 1200° C.

As will be understood from the foregoing explanation, the present invention is based on the discovery of the phenomenon that the silicon in a silicon substrate deteriorates the properties of a silicon nitride film formed by the direct nitridation process of the silicon substrate. It has also been discovered by the present inventors that oxygen, in the silicon substrate from the surface to 10 microns below the surface has a major influence on the properties of the silicon nitride film. The oxygen, which is present in the silicon substrate up to 10 micron below the surface, actually participates in the deterioration mentioned above because the out-diffusion of the oxygen in the silicon substrate takes place during the thermal nitridation process. When the oxygen concentration is $10^{18}/cm^3$ or more in the 10 micron thick surface portion of the silicon substrate, the quantity of the oxygen atoms present at such portion is sufficient for rendering the oxygen concentration of the silicon nitride film having a thickness of a few tens to a few hundreds Å to 1 atomic % or more. Such oxygen concentration of 1 atomic % or more is undesirable. Accordingly, the average oxygen concentration of the entire silicon substrate need not be $10^{18}/cm^3$ or less, provided that the average oxygen concentration of the oxygen from the surface to 10 microns below the surface of the silicon substrate is $10^{18}/cm^3$ or less. This fact indicates that, for example, the CZ substrate having a 10 micron or more thick epitaxial layer of an oxygen concentration of $10^{18}/cm^3$ can be used for the direct thermal nitridation.

Figure 2:
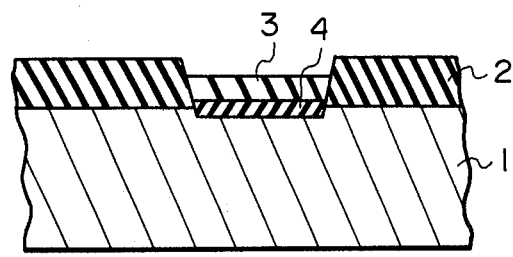
FIG. 2 shows an insulating film according to the present invention.

The present invention will now be explained further in detail by way of Examples and with reference to FIGS. 2 and 3. FIG. 2 is a partial cross sectional view of a semiconductor substrate, on which an insulating film is formed in the Examples. FIG. 3 is a graph illustrating the oxidation of the insulating film.

EXAMPLE 1

A CZ substrate having an average concentration of incorporated oxygen of $1.5 \times 10^{18}/cm^3$ and an FZ substrate having an average concentration of incorporated oxygen of $1 \times 10^{16}/cm^3$ were heated to a temperature of 1200° C., over a period of approximately 30 minutes, within an atmosphere, which was comprised of 99.99% or more of an ammonia gas. As a result, a 50 Å thick silicon nitride film was formed on each of the substrates. These substrates, on which the silicon nitride film had been formed, were then heated to 1000° C., within an atmosphere of oxygen and passed through having a temperature of 80° C. FIG. 3 illustrates the relationship between the heating time within the oxygen atmosphere and the thickness of a thermally oxidized film 4 (FIG. 2) which was formed between the silicon substrates 1 and the silicon nitride film 3. In FIG. 3, the abscissa designates the heating time and the ordinate designates the thickness of the thermally oxidized film. The dotted line in FIG. 3 indicates the change in the thickness of the oxidized film of silicon formed on the CZ substrate, while the solid line indicates the change in the thickness of such film formed on the FZ substrate. As is apparent from FIG. 3, an oxidized film of silicon is less liable to form under the silicon nitride film on the FZ substrate than in the case of the CZ substrate. This face demonstrates that the silicon nitride film formed on the FZ substrate is superior to that formed on the CZ substrate in the points of structural density and a masking effect against oxidation.

EXAMPLE 2

In the present example, a silicon nitride film was formed by following the same procedure as in Example 1, except for the concentrations of oxygen specified hereinbelow. In the present example, crystal defects, which were generated on the surface of the CZ and FZ substrates during the direct thermal nitridation of the substrates, were examined. The concentrations of oxygen incorporated in the substrates were as follows:

A. A CZ substrate having the concentration of $1.5 \times 10^{18}/cm^3$.

B. A FZ substrate having the concentration of $1 \times 10^{17}/cm^3$.

C. A CZ substrate having the concentration of $1-2\times 10^{18}/cm^3$.

After the formation of a silicon nitride film by direct thermal nitridation, the silicon substrates were oxidized through the silicon nitride film, so as to form an oxide film on the silicon substrates and to facilitate the observation of crystal defects. So-called swirl defects were observed on the substrate mentioned in items A and C above. The swirl defects generated on the CZ substrate mentioned in item C, above, were conspicuous. Generation of swirl defects was not observed at all on the FZ substrate mentioned in item B, above. A swirl defect is one type of crystal defect of silicon crystal substrates and consists of a cluster of minute defects in the form of a vortex. The generation of swirl defects demonstrates that crystal defects are induced on the surface of the substrate during the direct thermal nitridation. When substrates with swirl defects are used for the production of semiconductor devices, the electrical properties of the elements of these devices are poor. In addition, the production yield of these devices is low.

What we claim is:

1. A method for forming an insulating film having stable electrical properties and high density and which is suitable for a gate insulating film, by direct thermal nitridation of a surface portion of a silicon semiconductor substrate, comprising selecting said substrate to have a concentration of oxygen of not more than $10^{18}/cm^3$ at least in a surface layer of said substrate of at least 10 microns depth at the top of which said direct nitridation is to occur, and subjecting said substrate to a nitridizing gas atmosphere comprising nitrogen or a nitrogen compound, so as to convert the top portion of said substrate to said insulating film by direct thermal nitridation.

2. The method of claim 1 comprising heating said substrate to a temperature in the range from 900° to 1300° C. within said nitridizing gas atmosphere.

3. The method of claim 2, said temperature range being from 1000° to 1200°.

4. The method of claim 1, 2 or 3, said nitridizing gas atmosphere comprising nitrogen gas, with a maximum concentration of oxygen in said nitridizing gas atmosphere of 1 ppm.

5. The method of claim 1, 2 or 3, said nitridizing gas atmosphere comprising a nitrogen compound with a maximum concentration of oxygen in said nitridizing gas atmosphere of 1000 ppm.

6. The method of claim 5, said nitridizing gas atmosphere comprising ammonia or hydrazine.

7. The method of claim 1, 2 or 3, said substrate having an epitaxial layer of silicon formed thereon, said maximum oxygen concentration applying to the top 10 microns of the combination of said epitaxial layer on the surface of said substrate, and the top portion of said combination of said epitaxial layer on said substrate being subjected to said nitridizing gas atmosphere so as to form said insulating film by the nitridation of the top portion of said combination.

8. The method of claim 1, 2 or 3 comprising forming said insulating film to have a thickness in the range from $10^{-3}$ to $10^{-1}$ microns.

9. The method of claim 7, said epitaxial layer being more than 10 microns thick.

* * * * *

UNITED STATES PATENT AND TRADEMARK OFFICE
CERTIFICATE OF CORRECTION

PATENT NO. : 4,435,447

DATED : 6 March 1984

INVENTOR(S) : Ito et al

It is certified that error appears in the above-identified patent and that said Letters Patent is hereby corrected as shown below:

Column 1, line 42, "cature" should be --capture--.

Column 2, line 45, delete "sometimes".

Column 4, line 37, "Czochlarski" should be --Czochralski--;

line 41, "or" should be --are--.

Signed and Sealed this

Thirteenth Day of November 1984

[SEAL]

Attest:

GERALD J. MOSSINGHOFF

Attesting Officer

Commissioner of Patents and Trademarks